(12) United States Patent
Kuang et al.

(10) Patent No.: US 11,882,711 B2
(45) Date of Patent: Jan. 23, 2024

(54) PEROVSKITE CONTACTING PASSIVATING BARRIER LAYER FOR SOLAR CELLS

(71) Applicant: Technische Universiteit Eindhoven, Eindhoven (NL)

(72) Inventors: Yinghuan Kuang, Eindhoven (NL); Rudolf Emmanuel Isidore Schropp, Driebergen (NL); Dibyashree Koushik, Eindhoven (NL); Mariadriana Creatore, Veldhoven (NL); Sjoerd Veenstra, Eindhoven (NL)

(73) Assignee: Nederlandse Organisatie voor toegepast-natuurwetenschappelijk Onderzoek TNO, 's-Gravenhage (NL)

( * ) Notice: Subject to any disclaimer, the term of this patent is extended or adjusted under 35 U.S.C. 154(b) by 441 days.

(21) Appl. No.: 16/315,670

(22) PCT Filed: Jul. 7, 2017

(86) PCT No.: PCT/EP2017/067088
§ 371 (c)(1),
(2) Date: Jan. 7, 2019

(87) PCT Pub. No.: WO2018/007586
PCT Pub. Date: Jan. 11, 2018

(65) Prior Publication Data
US 2019/0229285 A1 Jul. 25, 2019

Related U.S. Application Data

(60) Provisional application No. 62/359,656, filed on Jul. 7, 2016.

(51) Int. Cl.
*H10K 30/88* (2023.01)
*H10K 30/10* (2023.01)
(Continued)

(52) U.S. Cl.
CPC ............. *H10K 30/88* (2023.02); *H10K 30/10* (2023.02); *H10K 30/40* (2023.02); *H10K 30/81* (2023.02);
(Continued)

(58) Field of Classification Search
CPC ............... H01L 51/448; H01L 51/4213; H01L 51/4293; H01L 51/441
See application file for complete search history.

(56) References Cited

U.S. PATENT DOCUMENTS

2015/0129034 A1* 5/2015 Snaith ................. H01L 31/0264
136/258

FOREIGN PATENT DOCUMENTS

CN 104183697 A 12/2014
CN 105047826 A 11/2015
(Continued)

OTHER PUBLICATIONS

Kang et al., "Water-repellent perovskite solar cell", J. Mater. Chem. A, 2014, 2, 20017-20021. (Year: 2014).*
(Continued)

*Primary Examiner* — Tae-Sik Kang
(74) *Attorney, Agent, or Firm* — N.V. Nederlandsch Octrooibureau

(57) ABSTRACT

A hybrid organic-inorganic solar cell is provided that includes a substrate, a transparent conductive oxide (TCO) layer deposited on the substrate, an n-type electron transport material (ETM) layer, a p-type hole transport material (HTM) layer, an i-type perovskite layer, and an electrode layer, where the substrate layers are arranged in an n-i-p stack, or a p-i-n stack, where the passivating barrier layer is disposed between the layers of the (i) perovskite and HTM, (ii) perovskite and ETM, (iii) perovskite and HTM, and perovskite and ETM, or (iv) TCO and ETM, and ETM and
(Continued)

perovskite, and perovskite and HTM, or (v) substrate and TCO, and TCO and ETM, and ETM and perovskite, and perovskite layer and HTM, or (vi) a pair of ETM layers, or (vii) a pair of HTM layers.

14 Claims, 17 Drawing Sheets

(51) Int. Cl.
  *H10K 30/40* (2023.01)
  *H10K 30/81* (2023.01)
  *H10K 85/00* (2023.01)
  *H10K 30/15* (2023.01)
  *H10K 85/20* (2023.01)
  *H10K 102/10* (2023.01)

(52) U.S. Cl.
  CPC ........... *H10K 85/00* (2023.02); *H10K 30/151* (2023.02); *H10K 85/211* (2023.02); *H10K 2102/101* (2023.02); *Y02E 10/549* (2013.01)

(56) References Cited

FOREIGN PATENT DOCUMENTS

| CN | 105449104 A | 3/2016 |
|---|---|---|
| JP | 2003-331937 A | 11/2003 |
| KR | 2015-0122598 A | 11/2015 |
| WO | 2015/080990 A1 | 4/2015 |
| WO | 2016/009450 A2 | 1/2016 |
| WO | WO2016/009450 A2 | 1/2016 |
| WO | 2016/083783 A1 | 6/2016 |

OTHER PUBLICATIONS

Zhao et al., "Effective hole extraction using MoOx-Al contact in perovskite CH3NH3PbI3 solar cells", Applied Physics Letters 104, 213906 (2014). (Year: 2014).*

Ito et al. "Effects of surface blocking layer of Sb2S3 on nanocrystalline TiO2 for CH3NH3PbI3 perovskite solar cells." The Journal of Physical Chemistry C 118.30 (2014): 16995-17000.

Dong, Xu et al., Improvement of the humidity stability of organic-inorganic perovskite solar cells using ultrathin Al2O3 layers prepared by atomic layer deposition, Journal of Materials Chemistry A, 2015, vol. 3., Issue 10 pp. 5360-5567.

Ito, Seigo et al., Effects of Surface Blocking Layer of Sb2S3 on Nanocrystalline TiO2 for CH3NH3PbI3 Perovskite Solar Cells, The Journal of Physical Chemistry C vol. 118, Issue 30, pp. 16995-17000.

* cited by examiner

PEROVSKITE CONTACTING PASSIVATING BARRIER LAYER FOR SOLAR CELLS

FIELD OF THE INVENTION

The current invention relates to solar cells. More particularly, the invention relates to passivating barrier layers disposed between the layers in a solar cell stack.

BACKGROUND OF THE INVENTION

Perovskite materials are of interest for photovoltaic solar cell applications, but are plagued by material stability issues. Such issues can arise from exposure to other materials used in solar cell fabrication as well as environmental exposure (water, oxygen etc.) over the lifetime of the cell. Attempts have been made to fabricate a passivating barrier layer on the perovskite layer of a solar cell, but results to date have been poor.

What is needed is a passivating barrier layer disposed in perovskite solar cells for enhanced performance.

SUMMARY OF THE INVENTION

To address the needs in the art, a hybrid organic-inorganic solar cell is provided that includes a substrate, a transparent conductive oxide (TCO) layer deposited on the substrate, an electron transport material (ETM) layer, where the ETM layer is an n-type layer, a hole transport material (HTM) layer, where the HTM is a p-type layer, at least one passivating barrier layer, a perovskite layer, where the perovskite layer is an i-type layer, and an electrode layer where the substrate, the TCO layer, the ETM layer, the perovskite layer, the HTM layer and the electrode layer are arranged in an n-i-p stack, or the substrate, the TCO layer, the HTM layer, the perovskite layer, the ETM layer and the electrode layer are arranged in a p-i-n stack, where the at least one passivating barrier layer is disposed (i) between the perovskite layer and the HTM layer, or (ii) between the perovskite and the ETM layer, or (iii) between the perovskite and the HTM layer, and between the perovskite layer and the ETM, or (iv) between the TCO layer and the ETM layer, and between the ETM layer and the perovskite layer, and between the perovskite layer and the HTM layer, or (v) between the substrate and the TCO layer, and between the TCO layer and the ETM layer, and between ETM layer and the perovskite layer, and between the perovskite layer and the HTM layer, or (vi) between a pair of the ETM layers, or (vii) between a pair of the HTM layers.

According to one aspect of the current invention, the ETM layer material includes Fullerene, ZnOS, $TiO_2$, $SnO_2$, ZnO, CdS, $Sb_2S_3$, $Bi_2S_3$, or any combination thereof. Here the Fullerene includes PCBM, or C60, where the Fullerene is doped or undoped.

In another aspect of the invention, the HTM layer material includes P3HT, Spiro-OMeTAD, PEDOT:PSS, $NiO_x$, $MoO_x$, $WO_x$, $CuO_x$, CuSCN, $V_2O_5$, $MoS_2$, $CuGaO_2$, PTAA, Poly-TPD, PbS, or any combination thereof. Here the P3HT, Spiro-OMeTAD, PTAA, and Poly-TPD are doped or undoped.

In a further aspect of the invention, the TCO layer material includes $In_2O_3$:$SnO_2$ (ITO), $In_2O_3$:H, $SnO_2$:F (FTO), $SnO_2$, ZnO:Al, ZnO:B, or any combination thereof.

In yet another aspect of the invention, the electrode layer material includes $In_2O_3$:$SnO_2$ (ITO), $In_2O_3$:H, ZnO:Al, ZnO:B, $SnO_2$, C, Au, Ag, Cu, Ni, or Al.

According to one aspect of the invention, the passivating barrier layer material includes $Al_2O_3$, $SnO_2$, $TiO_2$, ZnO, NiO, $MoO_x$, $CuO_x$, $CuGaO_x$, $Y_2O_3$, $SiN_x$, $SiO_2$, $Ta_2O$, Triflurorobutylamine hydroiodide (TFBA), $AlF_x$, LiF, or $PbI_2$.

In yet another aspect of the invention, an electrode that is proximal to the substrate can be a semi-transparent on non-transparent electrode.

In a further aspect of the invention, the perovskite layer material includes $CH_3NH_3PbI_3$, $CH_3NH_3PbCl_3$, $CH_3NH_3PbBr_3$, $CH_3NH_3PbI_{3-x}Cl$, $CH_3NH_3PbI_{3-x}Br_x$, $HC(NH_2)_2PbI_3$, $HC(NH_2)_2PbCl_3$, $HC(NH_2)_2PbBr_3$, $HC(NH_2)_2PbI_{3-x}Cl$, $HC(NH_2)_2PbI_{3-x}Br_x$, $[HC(NH_2)_2]_{1-x}Cs_xPbI_3$, $[HC(NH_2)_2]_{1-x}Cs_xPbI_{3-y}Br_y$, $CsPbI_{3-x}Br_x$, $CH_3NH_3Pb_{1-x}Sn_xI_{3-y}Br_y$, $(CH_3NH_3)_{1-x-y}[HC(NH_2)_2]_yCs_xPbI_{3-z}Br_z$, $(CH_3NH_3)_{1-x-y}[HC(NH_2)_2]_yCs_xPb_{1-z}Sn_zI_{3-\delta}Br_\delta$, and $(CH_3NH_3)_{1-x-y-z}[HC(NH_2)_2]_zCs_yRb_xPbI_{3-\delta}Br_\delta$. In one aspect the Pb of the perovskite is partially or completely replaced by other group IV elements.

DETAILED DESCRIPTION

The current invention provides improved devices and processes for fabricating at least one passivating barrier layer in perovskite solar cells and demonstrate superior performance. Thus the problem of high instability of hybrid organic-inorganic IV-halide perovskite solar cells is successfully addressed.

Figure 1:
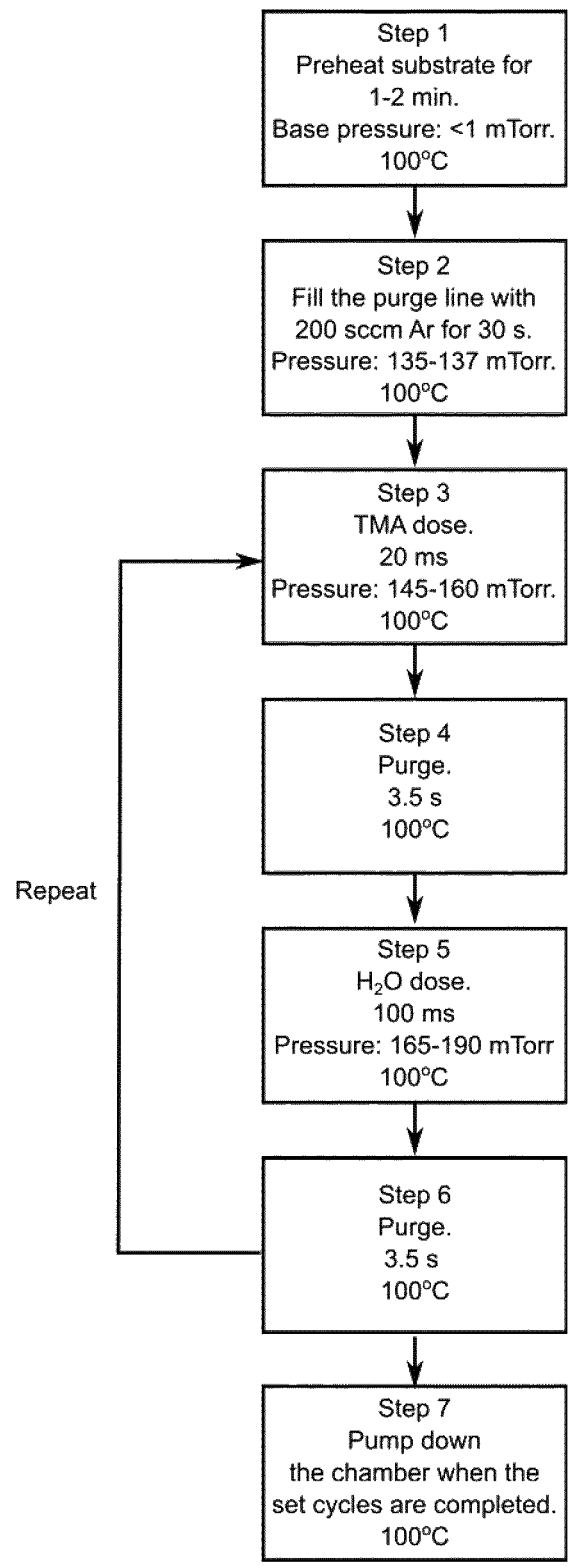
FIG. 1 shows a schematic drawing of exemplary ALD process for fabricating a passivating barrier layer in the hybrid organic-inorganic solar cell, according to one embodiment of the invention.

According to one example of the invention, a thin (e.g., between 0.2 nm and several nanometers thick) $Al_2O_3$ passivating barrier layer is used to seal off the sensitive perovskite layer. This layer protects the perovskite layer during further deposition of electron selective or hole selective contact layers as well as over the lifetime of the operational solar cell device against water, water vapor, and oxygen, yet it does not prevent the formation of a low-resistance contact to the perovskite layer. Here the $Al_2O_3$ passivating barrier layer is sufficiently thin that it provides a tunnel contact for the solar cell. This layer is preferably deposited using atomic layer deposition (ALD), from trimethylaluminum (TMA) and $H_2O$ at 100° C. An exemplary ALD process for this is schematically depicted in FIG. 1. In this example we used 4 ALD deposition cycles. Preferably the number of ALD cycles is from 1 to 10, and more preferably the number of ALD cycles is from 5 to 10.

Figure 2A:
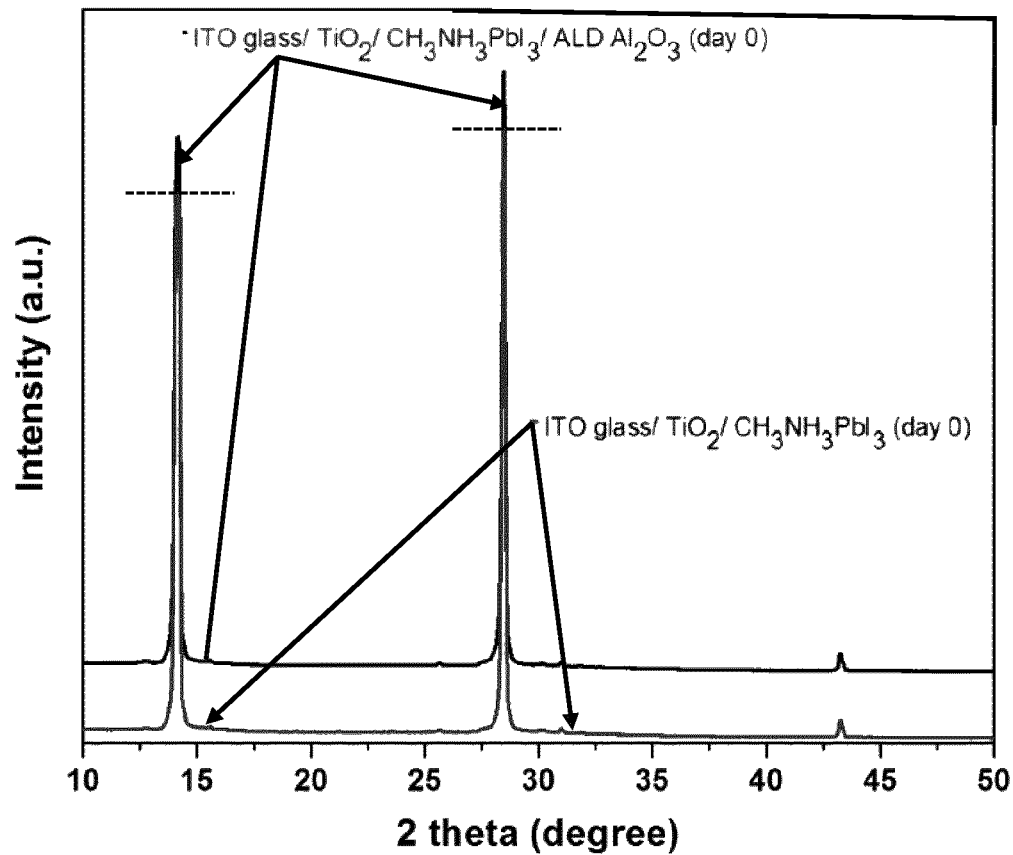
FIGS. 2A-2C show X-ray diffraction (XRD) spectra of the perovskite film with and without the $Al_2O_3$ contacting passivating barrier layer immediately after fabrication (day 0) (2A), without a passivating barrier layer (2B), and (2C) with a passivating barrier layer, according to one embodiment of the invention.
Figure 2B:
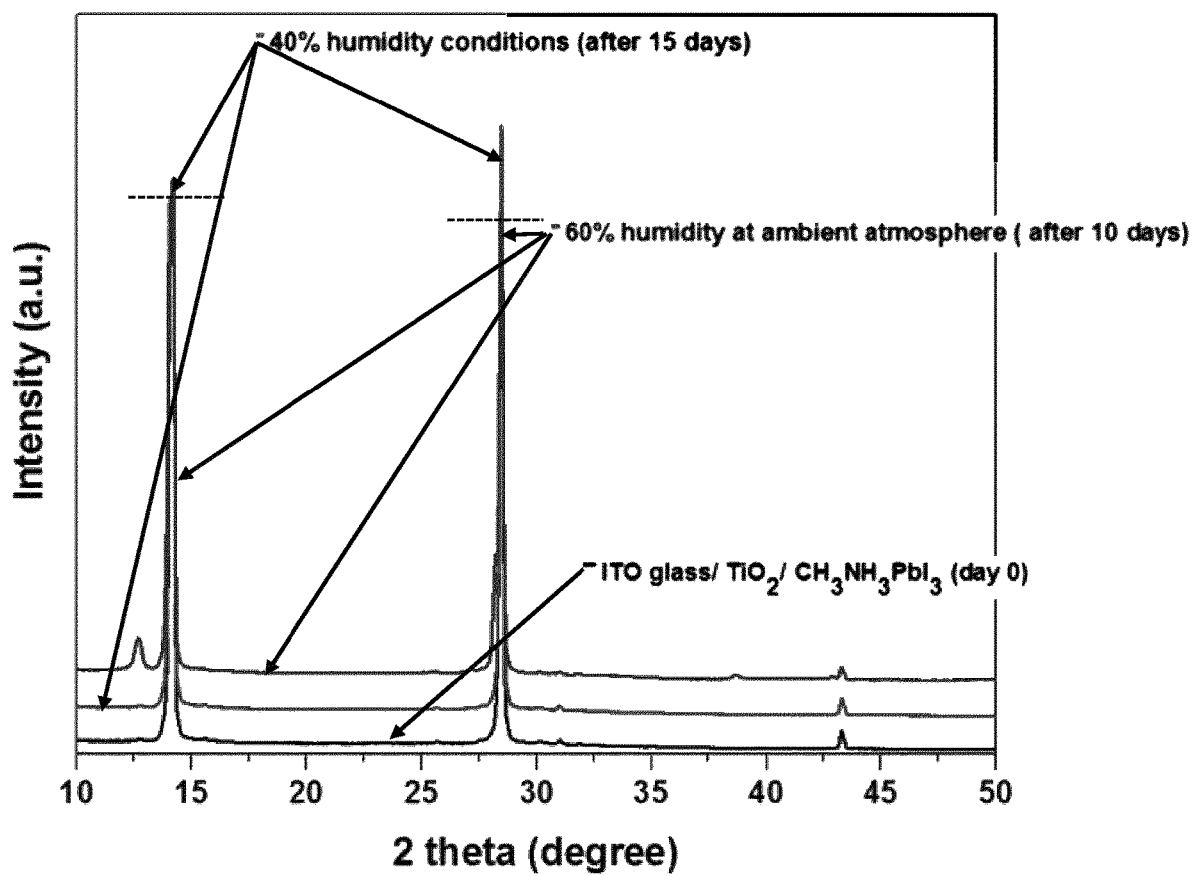
Figure 2C:
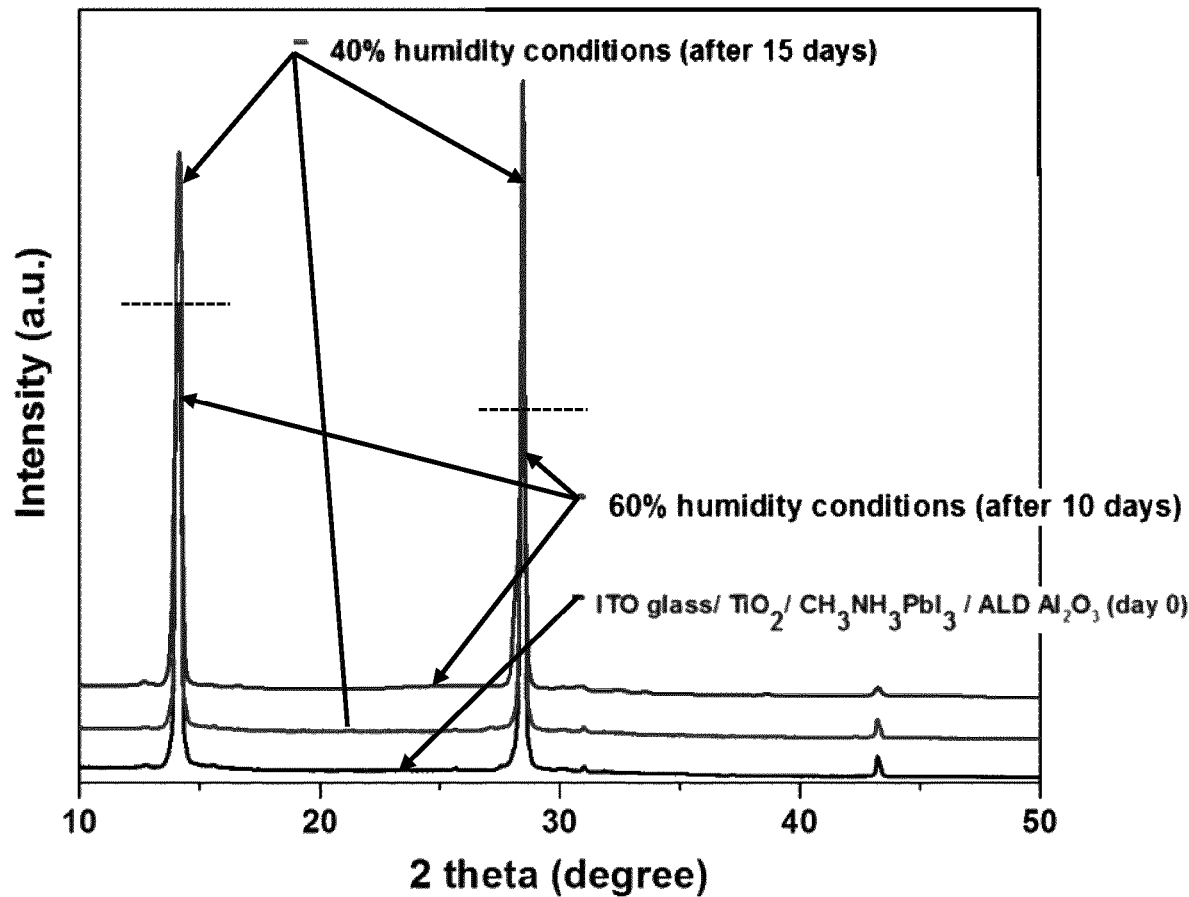

X-ray diffraction (XRD) spectra of the perovskite film with and without ALD $Al_2O_3$ on top are shown in FIG. 2A. There is no obvious change in the crystalline structure of the perovskite film before and after the deposition of ALD $Al_2O_3$ on top as confirmed by the characteristic peaks (14.10, 28.4° and 43.2°) present in both the respective spectra, and can be assigned to the (110), (220), and (330) peaks of the $CH_3NH_3PbI_3$. After exposure to humidity, the degradation of the perovskite without the ALD $Al_2O_3$ passivating barrier layer on top is seen from the appearance of a new peak at 12.6° in the XRD spectra of FIG. 2B. This peak is assigned to the (001) diffraction peak of $Pb_2$, which is formed as a result of the decomposition of the perovskite when exposed to oxygen and moisture. On the contrary, there is no appearance of this signature 12.6° peak of $PbI_2$ in the XRD spectra of the perovskite with ALD $Al_2O_3$ on top (FIG. 2C) when exposed to the same humidity conditions, which confirms that the ALD $Al_2O_3$ contacting the perovskite serves as a passivating barrier layer and enhances its stability.

Figure 3A:
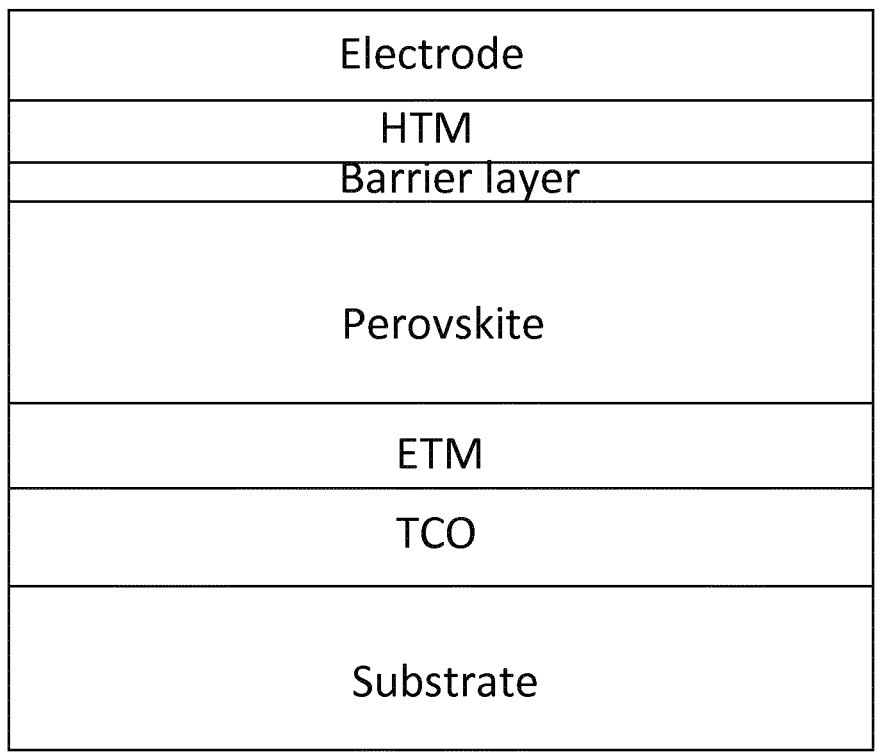
FIGS. 3A-3O show schematic drawings of passivating barrier layers deposited in hybrid organic-inorganic p-i-n and n-i-p solar cells, according to embodiments of the current invention.

Complete solar cell devices have been fabricated. FIGS. 3A-3O show exemplary embodiments of a hybrid organic-inorganic solar cell that include a substrate, a transparent conductive oxide (TCO) layer deposited on the substrate, an electron transport material (ETM) layer, where the ETM layer is an n-type layer, a hole transport material (HTM) layer, where the HTM is a p-type layer, at least one passivating barrier layer, a perovskite layer, where the perovskite layer is an i-type layer, and an electrode layer where the substrate, the TCO layer, the ETM layer, the perovskite layer, the HTM layer and the electrode layer are arranged in an n-i-p stack, or the substrate, the TCO layer, the HTM layer, the perovskite layer, the ETM layer and the electrode layer are arranged in a p-i-n stack, where the at least one passivating barrier layer is disposed (i) between the perovskite layer and the HTM layer, or (ii) between the perovskite and the ETM layer, or (iii) between the perovskite and the HTM layer, and between the perovskite layer and the ETM, or (iv) between the TCO layer and the ETM layer, and between the ETM layer and the perovskite layer, and between the perovskite layer and the HTM layer, or (v) between the substrate and the TCO layer, and between the TCO layer and the ETM layer, and between ETM layer and the perovskite layer, and between the perovskite layer and the HTM layer, or (vi) between a pair of the ETM layers, or (vii) between a pair of the HTM layers.

Figure 3B:
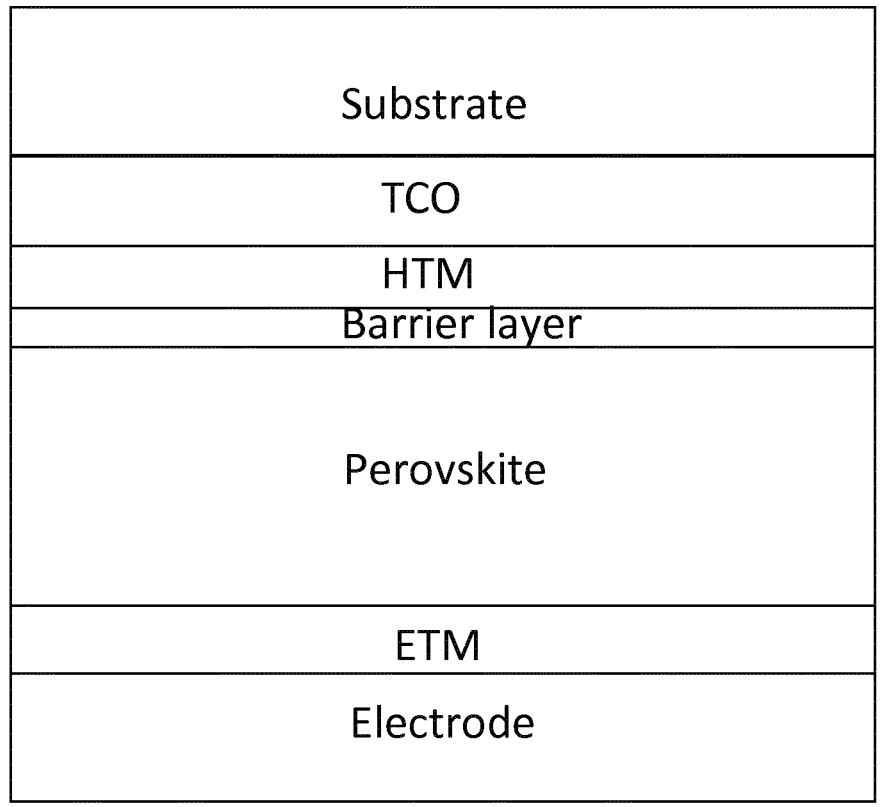
Figure 3C:
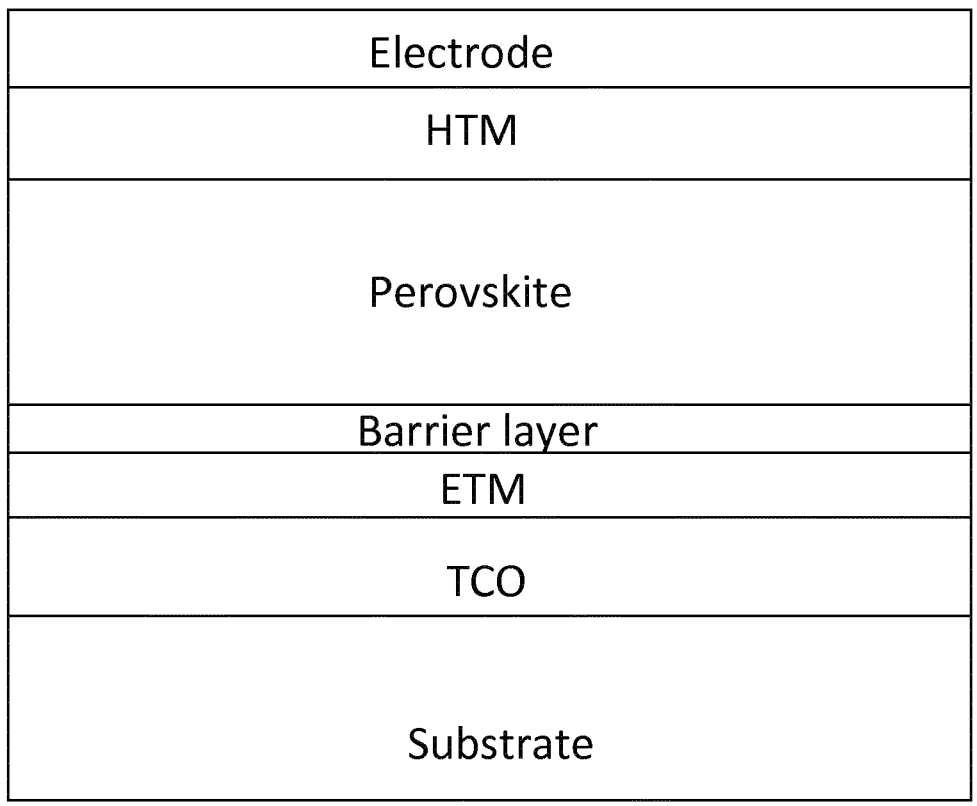
Figure 3D:
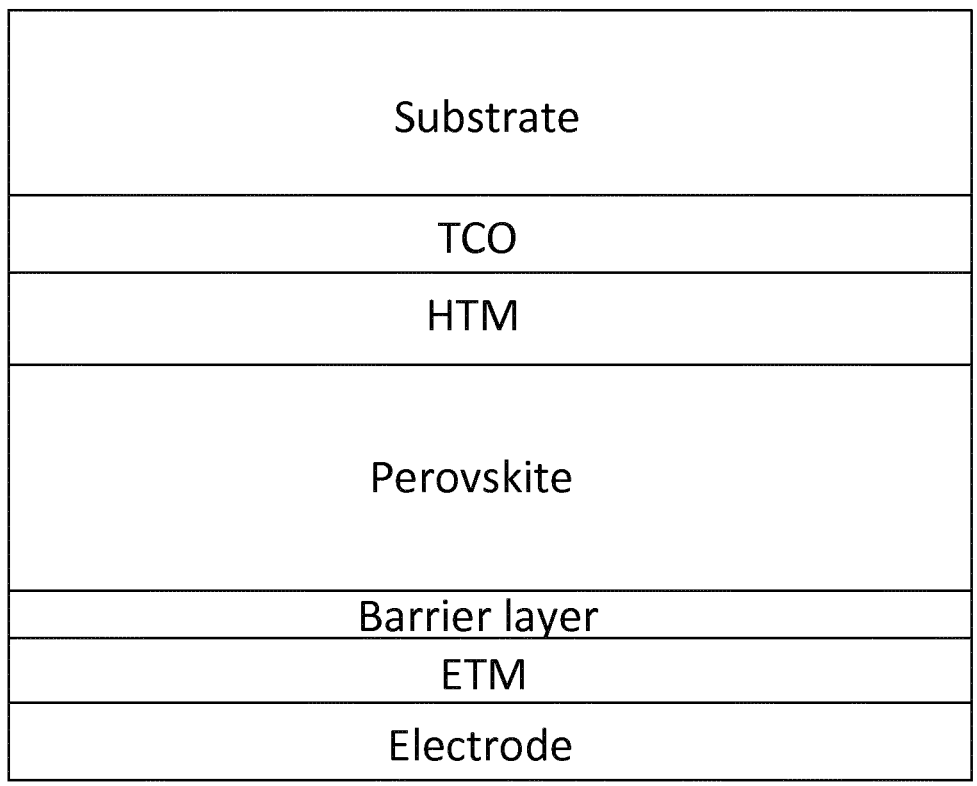
Figure 3E:
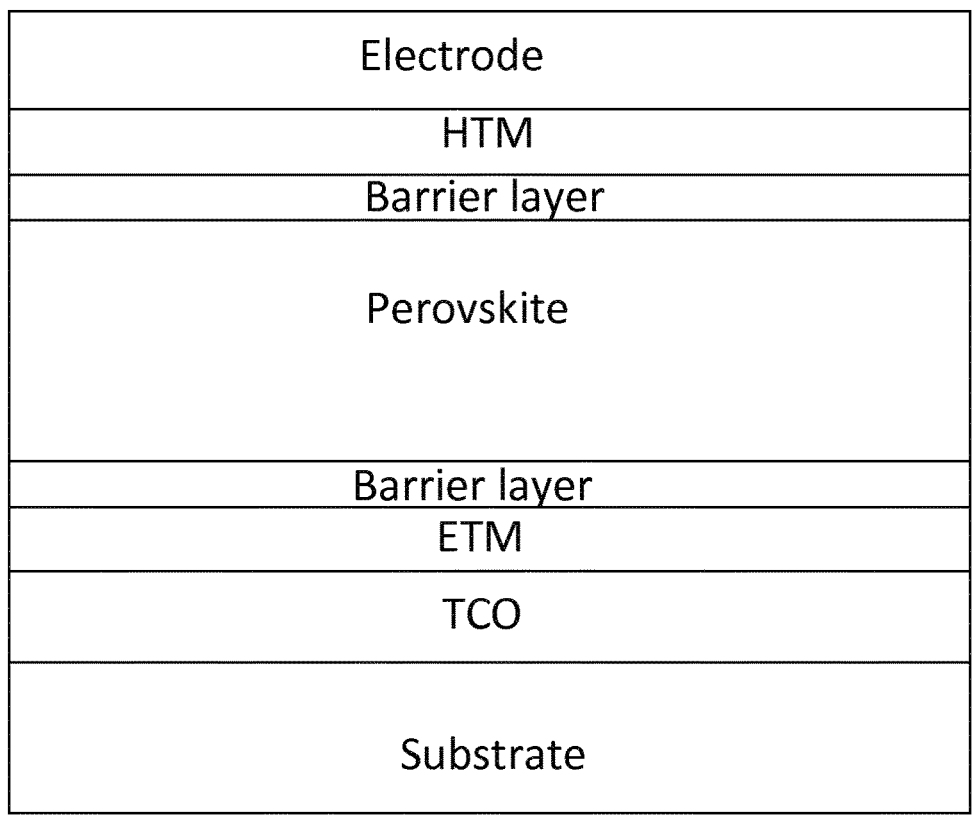
Figure 3F:
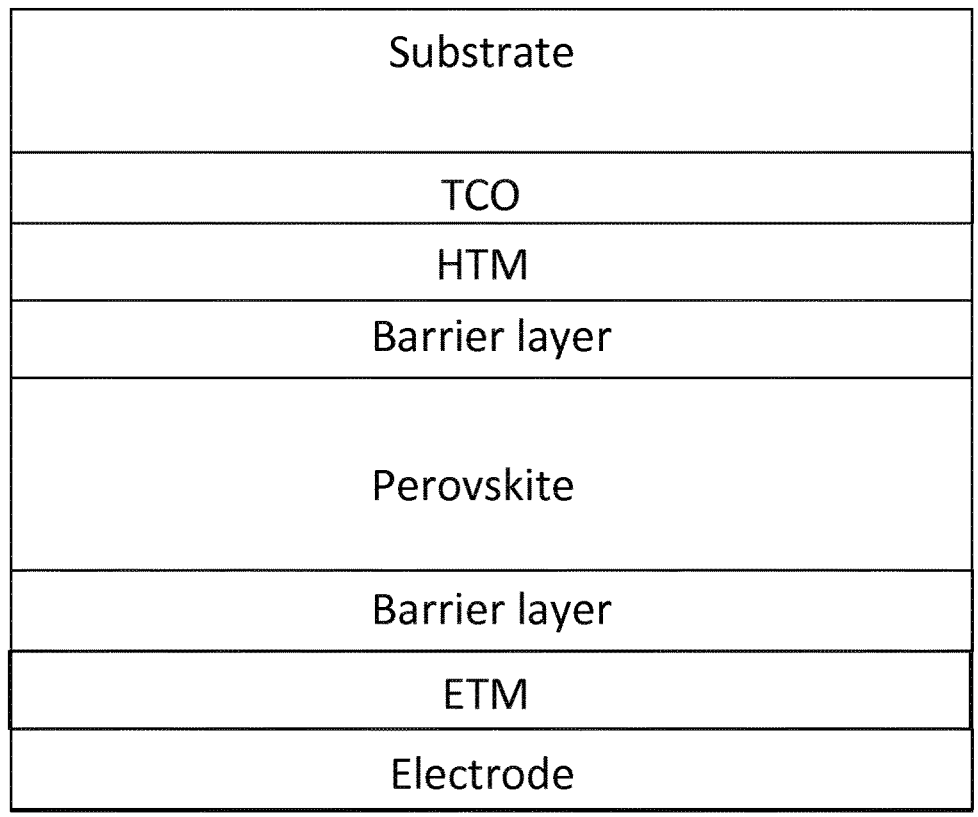
Figure 3G:
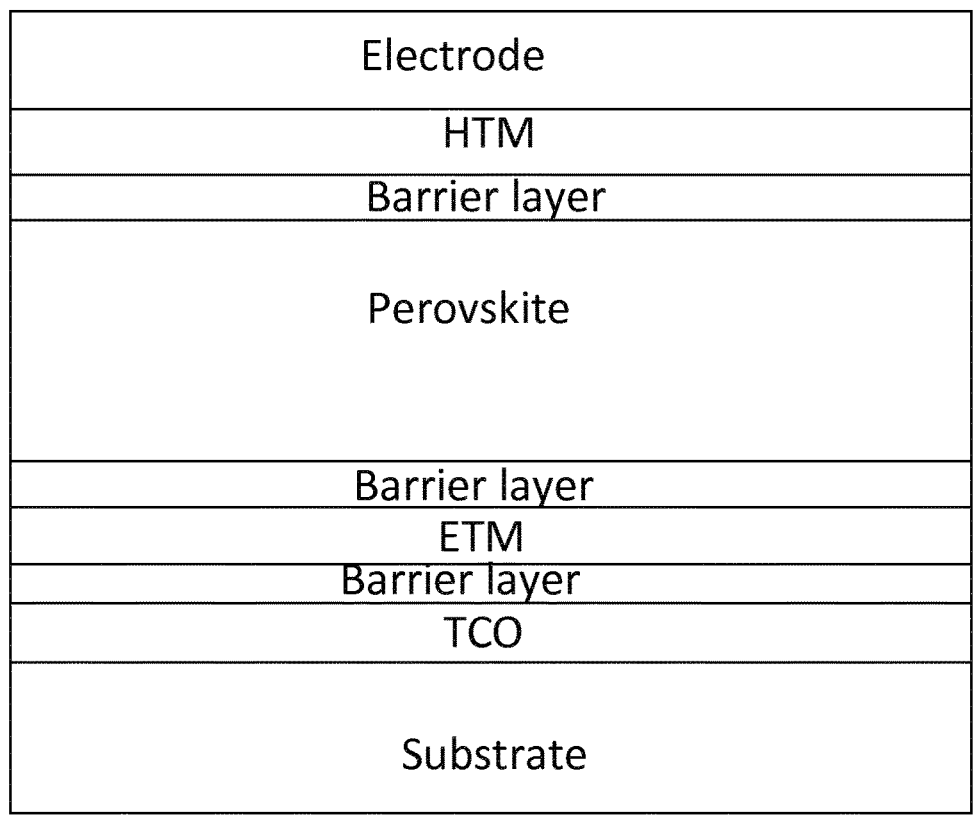
Figure 3H:
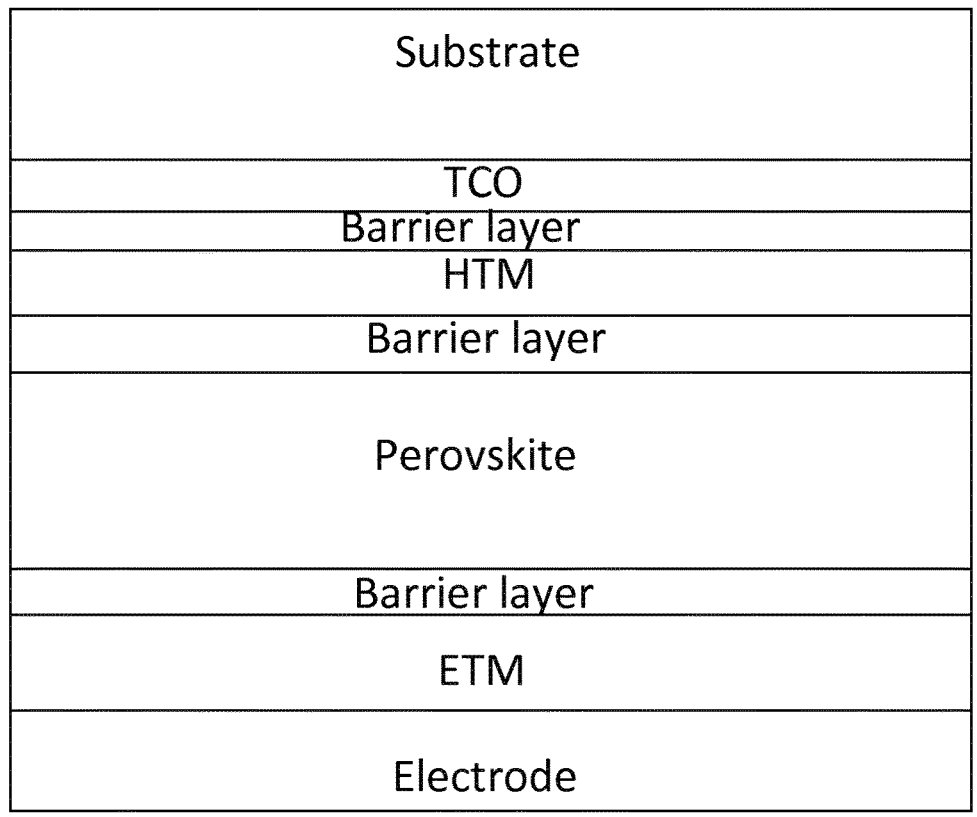
Figure 3I:
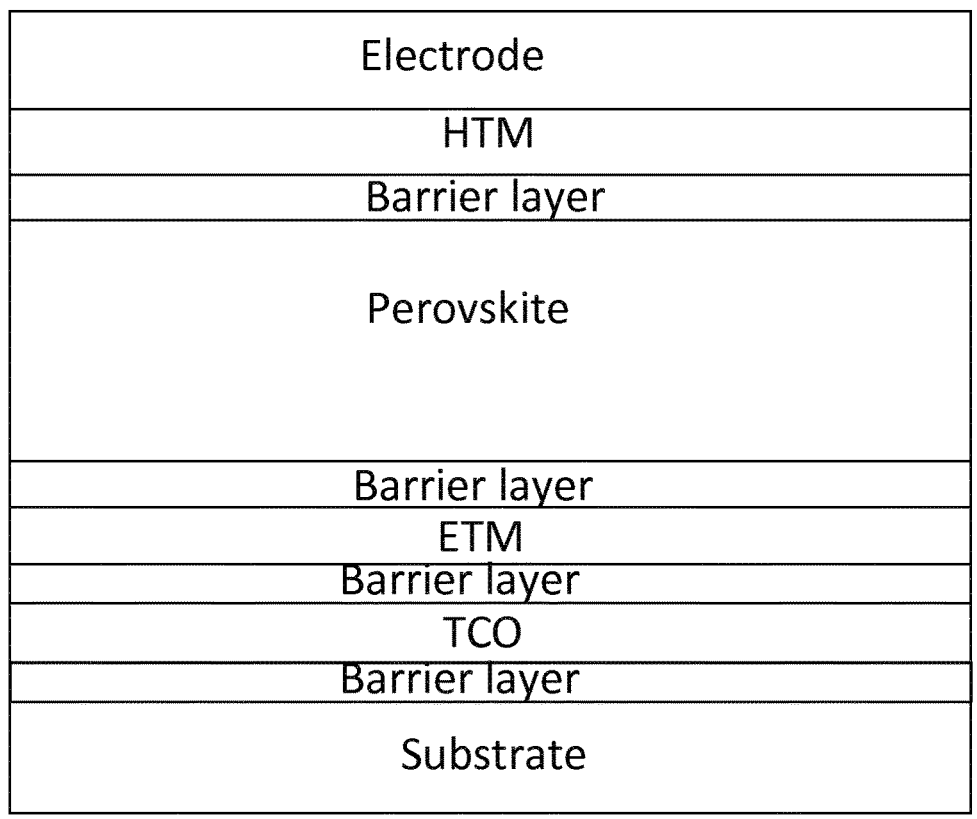
Figure 3J:
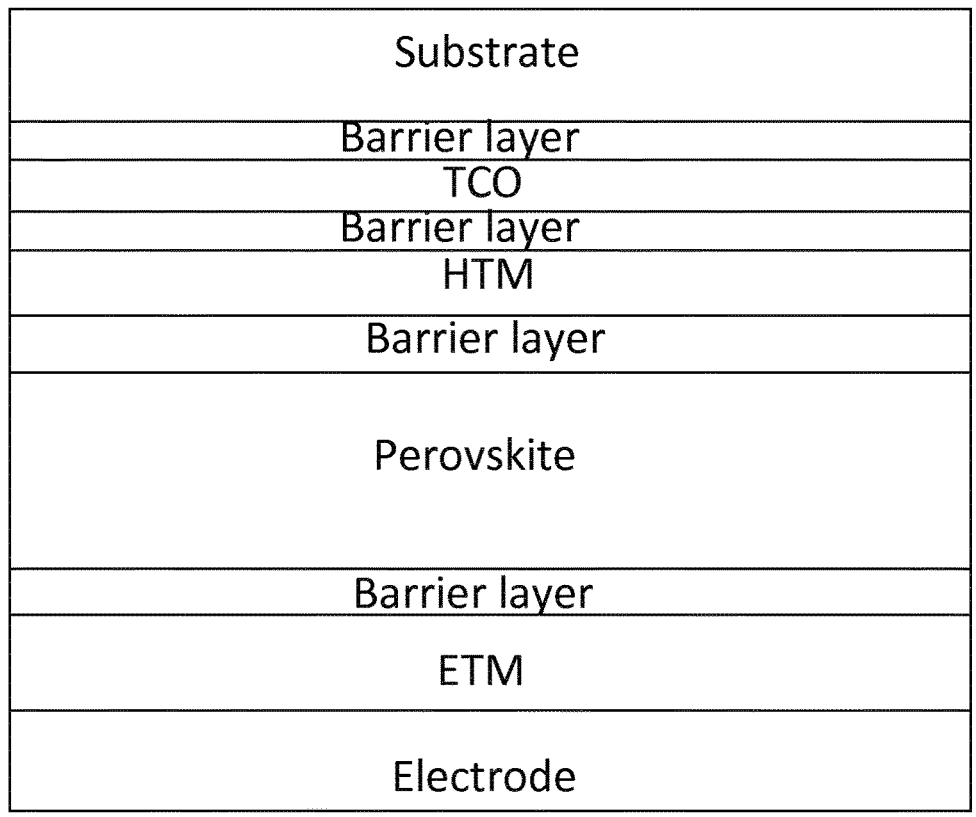
Figure 3K:
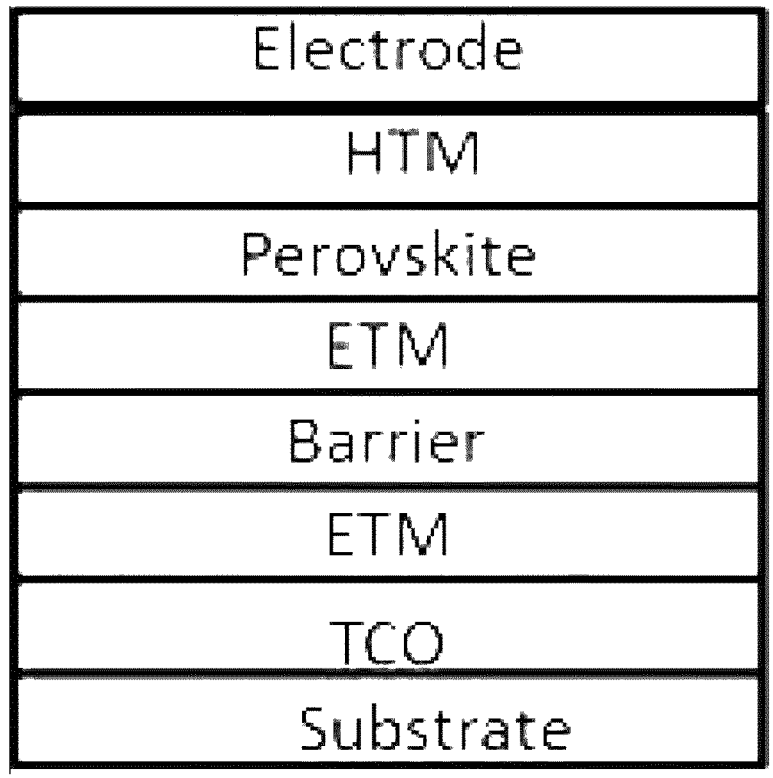
Figure 3L:
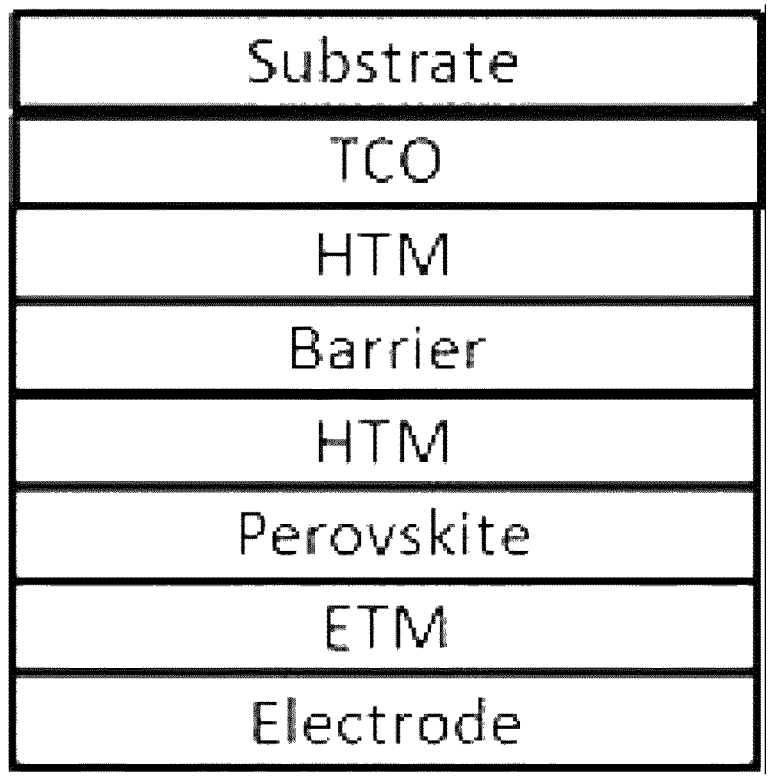
Figure 3M:
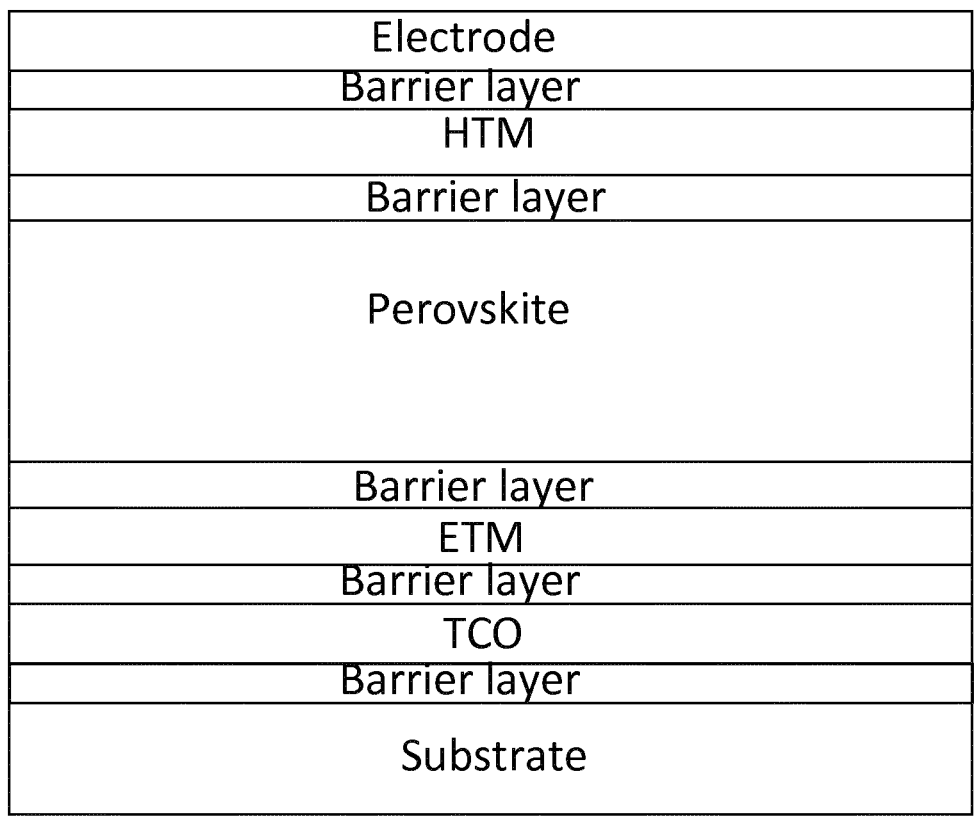
Figure 3N:
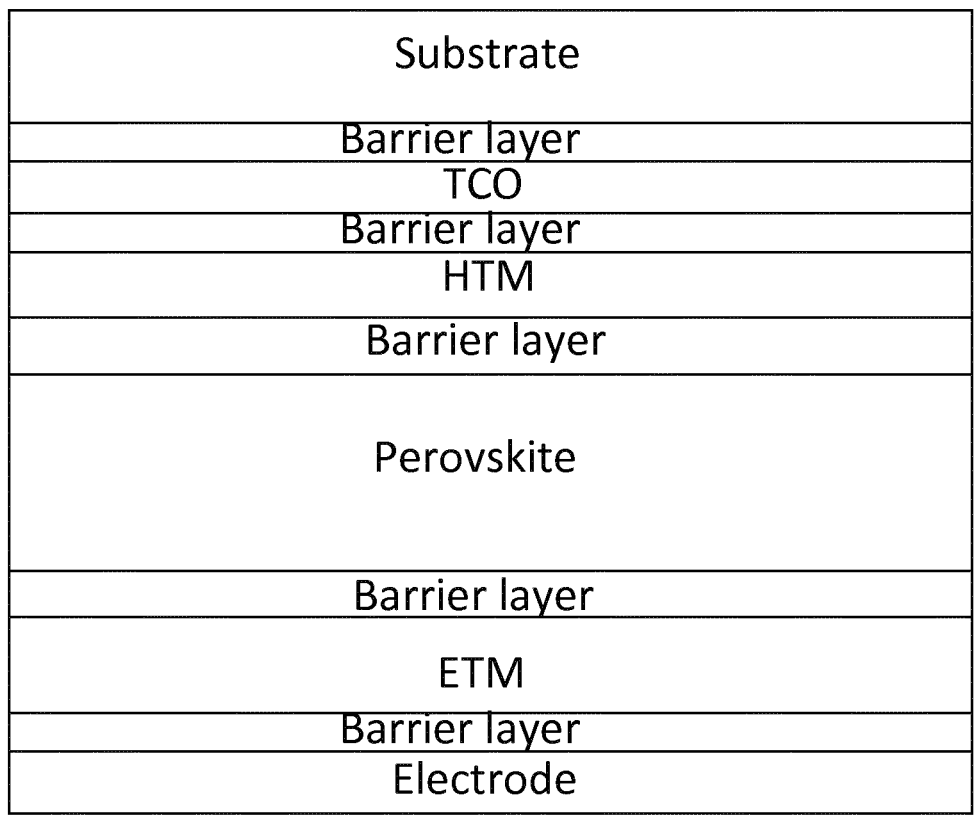
Figure 3O:
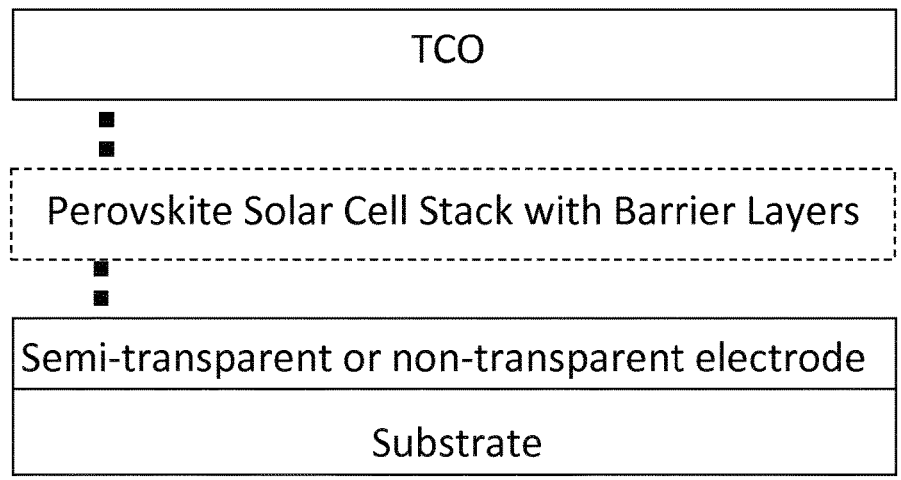

Experiments to date relate to the configuration of FIG. 3A-3B (passivating barrier layers between perovskite and hole transport material (HTM) shown in both p-i-n and n-i-p configurations), although the configurations of FIG. 3C-3D (passivating barrier layers between perovskite and electron transport material (ETM) shown in both p-i-n and n-i-p configurations) and FIG. 3E-3F (barriers layers between perovskite and HTM and between perovskite and ETM shown in both p-i-n and n-i-p configurations) are also possible. Here an important feature of all examples is that the passivating barrier layer is directly on the photoactive perovskite layer. FIGS. 3G-3N show passivating barrier layers between multiple layers of the hybrid organic-inorganic p-i-n and n-i-p solar cells, according to embodiments of the invention. The perovskite solar cell contains two electrodes of which at least one should be transparent. One of the electrodes can therefore be non-transparent. FIG. 3O shows a solar cell stack having a transparent conducting oxide layer that is distal to the substrate layer and a non-transparent or semi-transparent electrode that is proximal to the substrate layer.

In a further aspect of the invention, the electrode close to the substrate can therefore also be semi-transparent on non-transparent. In the FIGS. 3A-3L, the TCO is always close to the substrate. However, if the top electrode is transparent, the electrode close to the substrate can be non-transparent.

According to one aspect of the current invention, the ETM layer material includes Fullerene, ZnOS, $TiO_2$, $SnO_2$, ZnO, CdS, $Sb_2S_3$, $Bi_2S_3$, or any combination thereof. Here the Fullerene includes PCBM, or C60, where the Fullerene is doped or undoped.

In another aspect of the invention, the HTM layer material includes P3HT, Spiro-OMeTAD, PEDOT:PSS, $NiO_x$, $MoO_x$, $WO_x$, $CuO_x$, CuSCN, $V_2O_5$, $MoS_2$, $CuGaO_2$, PTAA, Poly-TPD, PbS, or any combination thereof. Here the P3HT, Spiro-OMeTAD, PTAA, and Poly-TPD are doped or undoped.

In a further aspect of the invention, the TCO layer material includes $In_2O_3$:$SnO_2$ (ITO), $In_2O_3$:H, $SnO_2$:F (FTO), $SnO_2$, ZnO:Al, or ZnO:B, or any combination thereof.

In yet another aspect of the invention, the electrode layer material includes $In_2O_3$:$SnO_2$ (ITO), $In_2O_3$:H, ZnO:Al, ZnO:B, $SnO_2$, C, Au, Ag, Cu, Ni, or Al.

According to one aspect of the invention, the passivating barrier layer material includes of $Al_2O_3$, $SnO_2$, $TiO_2$, ZnO, NiO, MoO3, CuO, $CuGaO_2$, $Y_2O_3$, $SiN_x$, $SiO_2$, $Ta_2O_5$, Triflurorobutylamine hydroiodide (TFBA), $AlF_x$, LiF, or $PbI_2$.

In a further aspect of the invention, the perovskite layer material includes $CH_3NH_3PbI_3$, $CH_3NH_3PbCl_3$, $CH_3NH_3PbBr_3$, $CH_3NH_3PbI_{3-x}Cl$, $CH_3NH_3PbI_{3-x}Br_x$, $HC(NH_2)_2PbI_3$, $HC(NH_2)_2PbCl_3$, $HC(NH_2)_2PbBr_3$, $HC(NH_2)_2PbI_{3-x}Cl$, $HC(NH_2)_2PbI_{3-x}Br_x$, $[HC(NH_2)_2]_{1-x}Cs_xPbI_3$, $[HC(NH_2)_2]_{1-x}Cs_xPbI_{3-y}Br_y$, $CsPbI_{3-x}Br_x$, $CH_3NH_3Pb_{1-x}Sn_xI_{3-y}Br_y$, $(CH_3NH_3)_{1-x-y}[HC(NH_2)_2]_yCs_xPbI_{3-z}Br_z$, $(CH_3NH_3)_{1-x-y}[HC(NH_2)_2]_yCs_xPb_{1-z}Sn_zI_{3-\delta}Br_\delta$, and $(CH_3NH_3)_{1-x-y-z}[HC(NH_2)_2]_zCs_yRb_xPbI_{3-\delta}Br_\delta$. In one aspect the Pb of the perovskite is partially or completely replaced by other group IV elements.

Figure 4A:
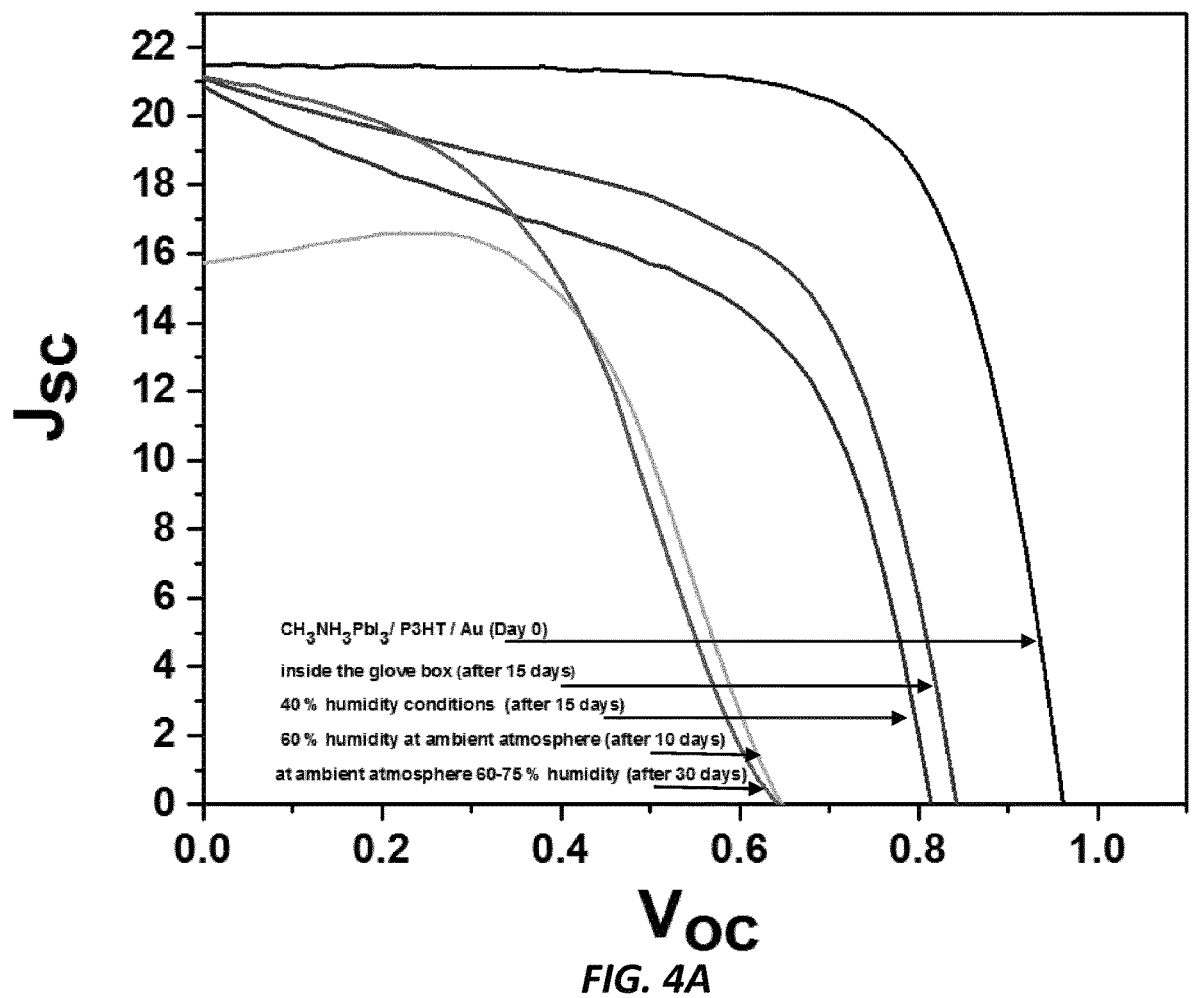
FIG. 4A shows experimental data of degradation without the $Al_2O_3$ contacting passivating barrier layer.
Figure 4B:
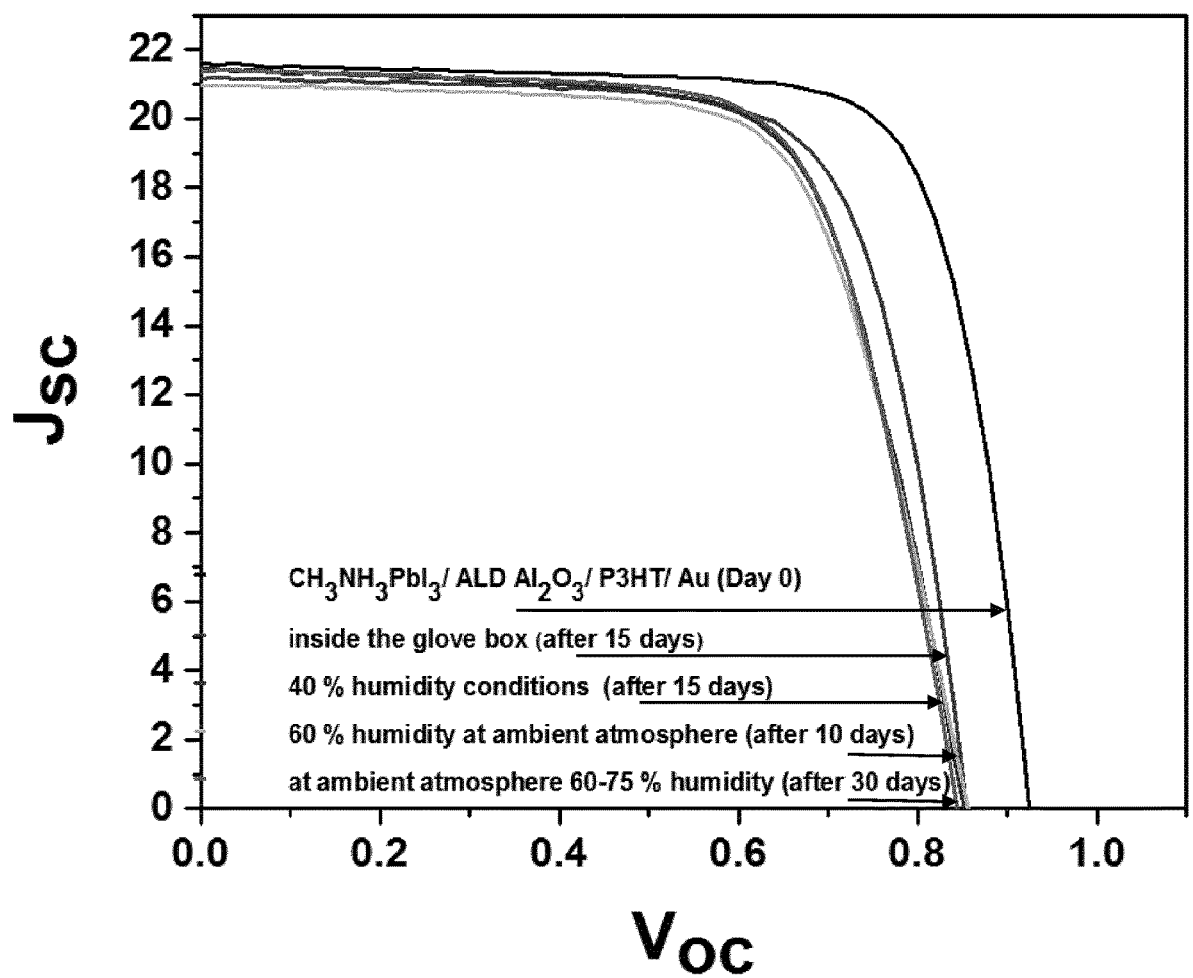
FIG. 4B shows experimental data of reduced degradation with the $Al_2O_3$ contacting passivating barrier layer, according to one embodiment of the invention.

In a first example, poly(3-hexylthiophene) (P3HT) is used as the hole transport material. FIG. 4A shows degradation without the $Al_2O_3$ contacting passivating barrier layer. FIG. 4B shows reduced degradation with the $Al_2O_3$ contacting passivating barrier layer.

Figure 5A:
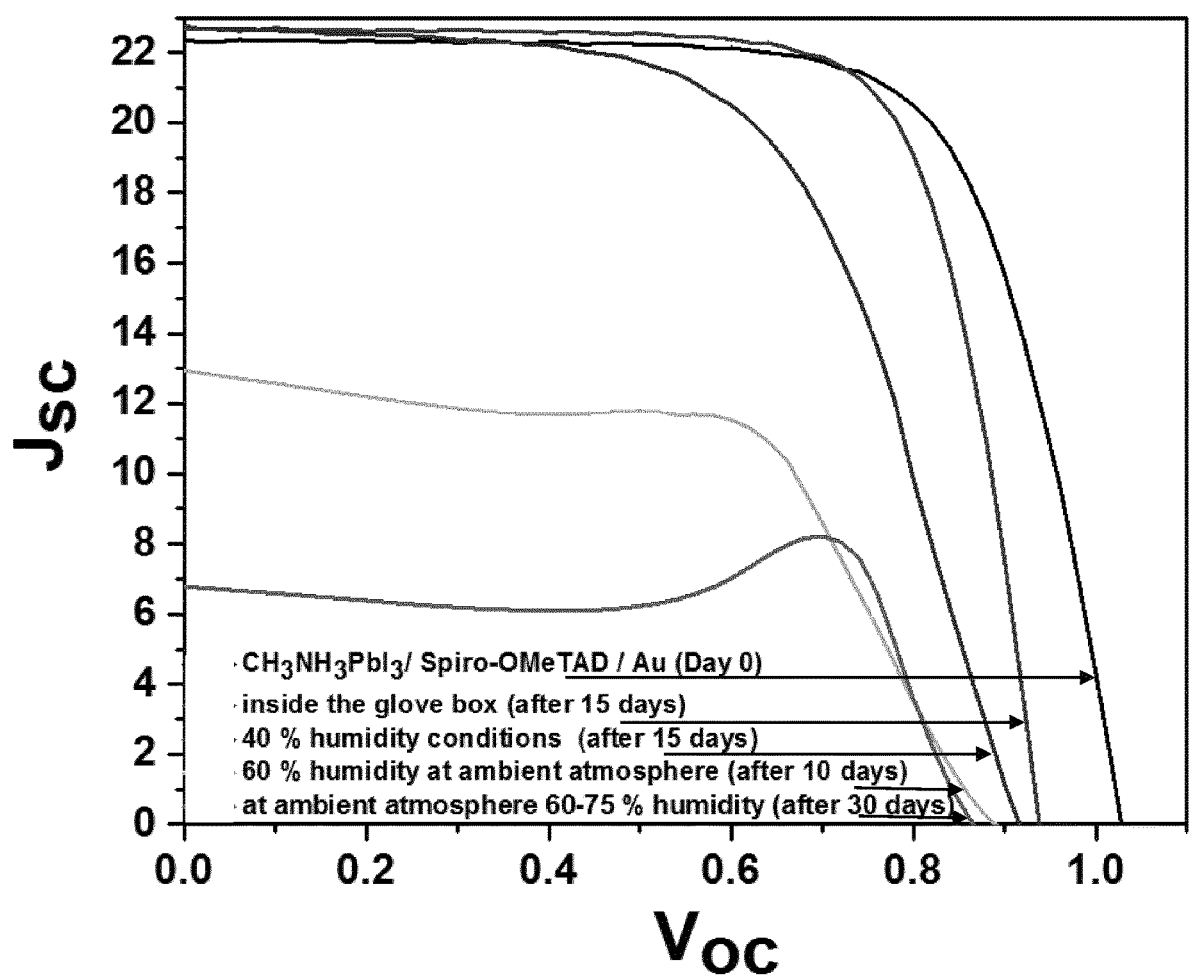
FIG. 5A shows experimental data of degradation without the $Al_2O_3$ contacting passivating barrier layer.
Figure 5B:
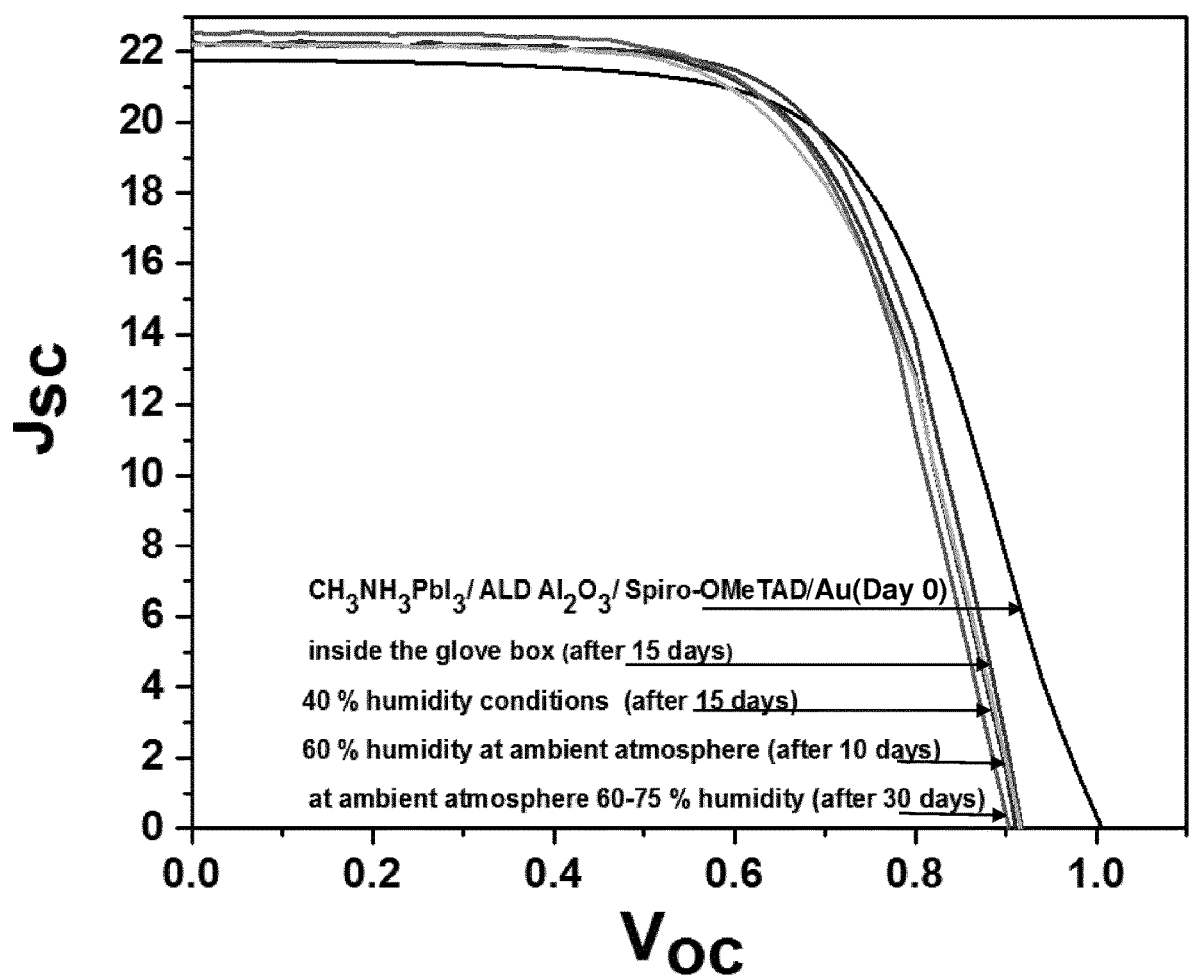
FIG. 5B shows experimental data of reduced degradation with the $Al_2O_3$ contacting passivating barrier layer, according to one embodiment of the invention.

In a second example, 2,2',7,7'-tetrakis(N,N-di-p-methoxyphenyl-amine)9,9'-spirobifluorene (Spiro-OMeTAD) is used as the hole transport material. FIG. 5A shows degradation without the $Al_2O_3$ contacting passivating barrier layer. FIG. 5B shows reduced degradation with the $Al_2O_3$ contacting passivating barrier layer.

Figure 6A:
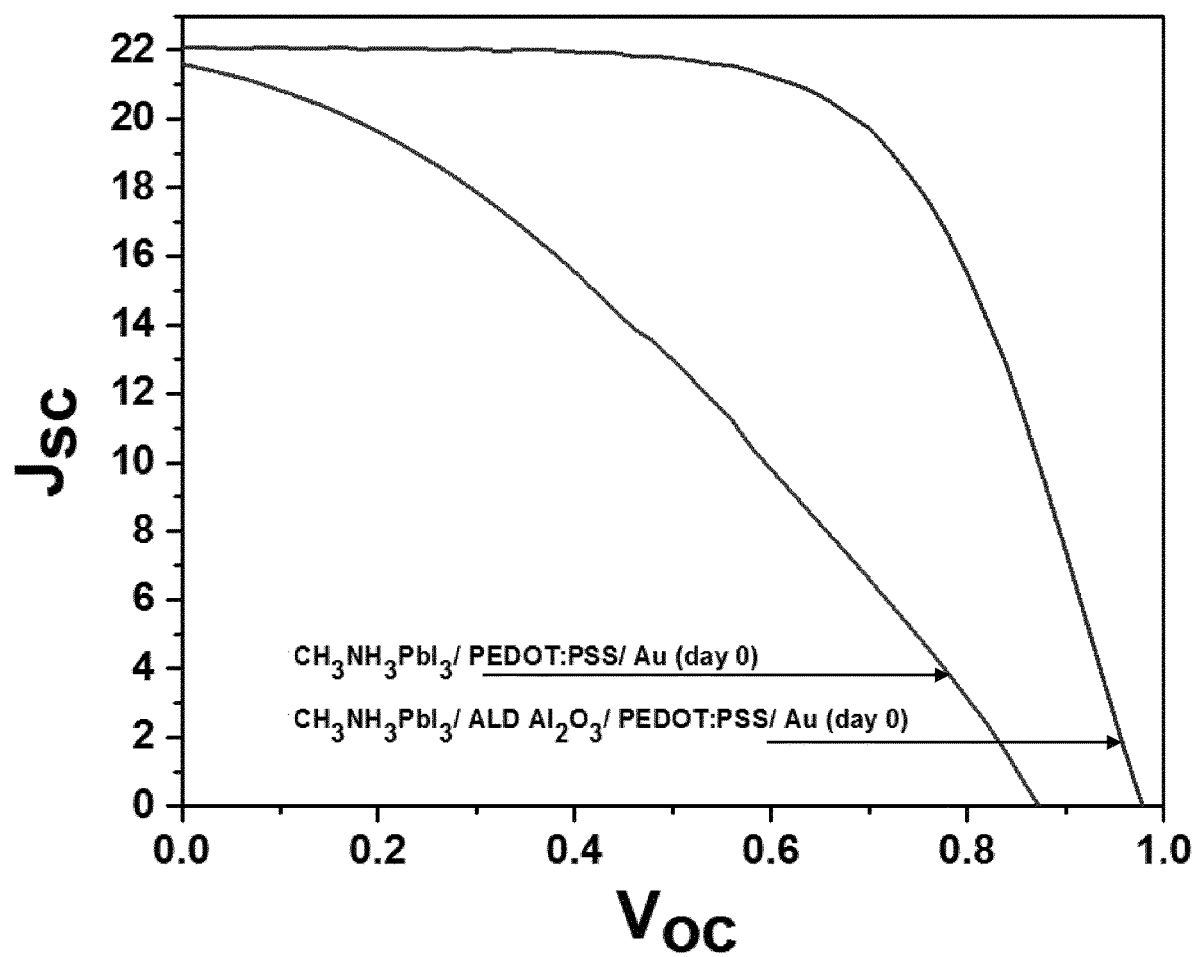
FIG. 6A compares the cell performance with and without the $Al_2O_3$ contacting passivating barrier layer immediately after fabrication (day 0), according to one embodiment of the invention.
Figure 6B:
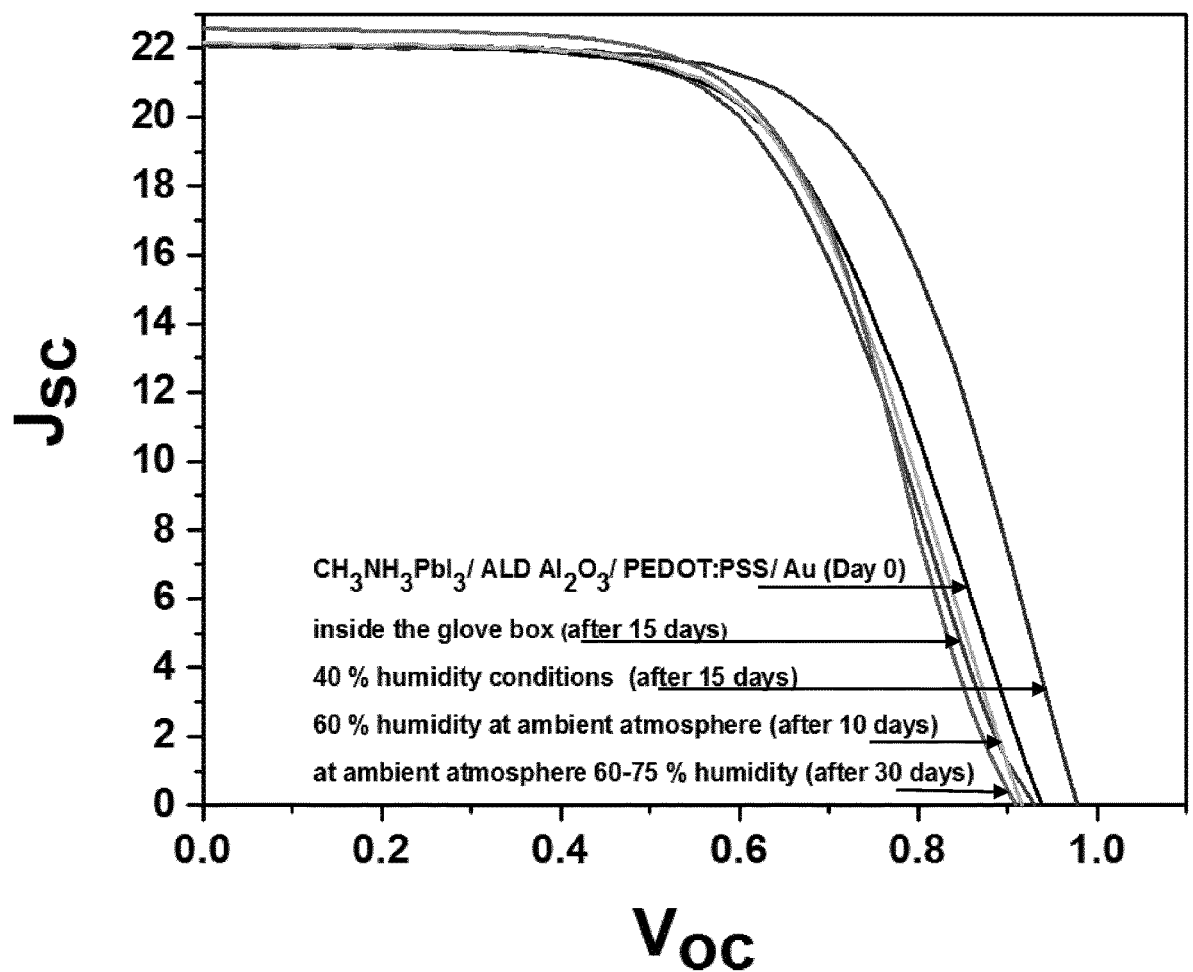
FIG. 6B shows virtually no degradation with the $Al_2O_3$ contacting passivating barrier layer, according to one embodiment of the invention.

In a third example, poly(3,4-ethylenedioxythiophene): poly(styrene sulfonate) (PEDOT:PSS) is used as the hole transport material. FIG. 6A compares the cell performance with and without the $Al_2O_3$ contacting passivating barrier layer immediately after fabrication (day 0). It is seen that without the use of the $Al_2O_3$ contacting passivating barrier layer, the cells cannot properly be fabricated. Using the $Al_2O_3$ contacting passivating barrier layer the cells have good initial I-V performance. Moreover, in FIG. 6B it is shown that there is virtually no degradation with the $Al_2O_3$ contacting passivating barrier layer. In the case of PEDOT: PSS as the HTM, the $Al_2O_3$ layer not only protects the device from humidity, but it is also important to enable the processing of perovskite cells using PEDOT:PSS as the HTM.

In all cases, there is no deterioration of initial cell efficiencies when the $Al_2O_3$ passivating barrier layer is used compared to the cells without the $Al_2O_3$ passivating barrier layer. Cells were exposed to 40% humidity atmospheric conditions for 15 days, then to 60% humidity for 10 more days, and then to ambient laboratory atmosphere (60-75% humidity) for 30 more days. Greatly improved stability of the devices under humid conditions is provided by the passivating barrier layers. The I-V performance is retained in the structures having the passivating barrier layer, while performance of cells without the passivating barrier layer degrades severely over time.

The present invention has now been described in accordance with several exemplary embodiments, which are intended to be illustrative in all aspects, rather than restrictive. Thus, the present invention is capable of many variations in detailed implementation, which may be derived from the description contained herein by a person of ordinary skill in the art. For example the ETM (or HTM) has preferably three main functions:

1. good electron transport (good hole transport);
2. good hole blocking properties (good electron blocking properties); and
3. barrier properties that include passivation functionality, and chemical diffusion barrier functionality. Here, the passivation functionality (i.e. a chemical reaction or physisorption with reactive species with neighboring layer(s)), where this functionality can have two effects: (i) reducing bulk and/or interface recombination, which applies to the perovskite layer and the interface of the perovskite with a neighboring layer, and (ii) preventing degradation reactions involving the above mentioned reactive species, which applies to any of the layers in the stack.

Further, the chemical diffusion barrier functionality includes protection against $H_2O$, $CO_2$, $O_2$, solvents, decomposition materials of other layers (e.g. MAI, etc.).

Further, the above-mentioned properties can be realized in several layers: e.g. the ETM may consist of: 1 electron transport layer, 1 hole blocking layer, 1 passivating barrier layer. However, it is also possible to combine 2 or 3 properties in a single layer. Of course, more passivating barrier layers can be introduced to protect the layers constituting the ETM, HTM, TCO and electrode. Therefore the barrier can be placed on different locations as depicted in the many device stacks.

All such variations are considered to be within the scope and spirit of the present invention as defined by the following claims and their legal equivalents.

What is claimed:

1. A hybrid organic-inorganic solar cell, comprising:
   a) a substrate;
   b) a transparent conductive oxide (TCO) layer deposited on said substrate;
   c) an electron transport material (ETM) layer, wherein said ETM layer comprises an n-type layer;
   d) a hole transport material (HTM) layer wherein said HTM layer comprises a p-type layer;
   e) at least one passivating barrier layer;
   f) a perovskite layer, wherein said perovskite layer comprises an i-type layer; and
   g) an electrode layer;
   wherein said substrate, said TCO layer, said ETM layer, said perovskite layer, said HTM layer and said electrode layer are arranged in an n-i-p stack;
   wherein said at least one passivating barrier layer is on the perovskite layer and disposed (i) between said perovskite layer and said HTM layer, or (ii) between said perovskite and said ETM layer, or (iii) between said perovskite and said HTM layer, and between said perovskite layer and said ETM layer, or (iv) between said TCO layer and said ETM layer, and between said ETM layer and said perovskite layer, and between said perovskite layer and said HTM layer, or (v) between said substrate and said TCO layer, and between said TCO layer and said ETM layer, and between said ETM layer and said perovskite layer, and between said perovskite layer and said HTM layer,
   wherein said at least one passivating barrier layer comprises a material selected from the group consisting of $Al_2O_3$, $SnO_2$, ZnO, and $NiO_x$, and
   wherein the at least one passivating barrier layer is configured to seal off the perovskite layer.

2. The hybrid organic-inorganic solar cell of claim 1, wherein said ETM layer comprises material selected from the group consisting of Fullerene, ZnOS, $TiO_x$, $SnO_x$, $ZnO_x$, CdS, $Sb_2S_3$, and $Bi_2S_3$.

3. The hybrid organic-inorganic solar cell of claim 2, wherein said Fullerene comprises PCBM, or C60.

4. The hybrid organic-inorganic solar cell of claim 2, wherein said Fullerene is doped or undoped.

5. The hybrid organic-inorganic solar cell of claim 1, wherein said HTM layer comprises material selected from the group consisted of P3HT, Spiro-OMeTAD, PEDOT: PSS, $NiO_x$, $MoO_x$, $WO_x$, $CuO_x$, $Cu[SCN]_x$, $V_2O_5$, $MoS_2$, $CuGaO_2$, PTAA, Poly-TPD and PbS.

6. The hybrid organic-inorganic solar cell of claim 5, wherein said P3HT, Spiro-OMeTAD, PTAA, and Poly-TPD are doped or undoped.

7. The hybrid organic-inorganic solar cell of claim 1, wherein a material of said TCO layer is selected from the group consisting of $In_2O_3$:$SnO_2$ (ITO), $In_2O_3$:H, $SnO_2$:F (FTO), $SnO_2$, ZnO:Al, and ZnO:B.

8. The hybrid organic-inorganic solar cell of claim 1, wherein a material of said electrode layer is selected from $In_2O_3$:$SnO_2$ (ITO), $In_2O_3$:H, ZnO:Al, ZnO:B, $SnO_2$, C, Au, Ag, Cu, Ni, and Al.

9. The hybrid organic-inorganic solar cell of claim 1, wherein said at least one passivating barrier layer comprises material consisting of $Al_2O_3$.

10. The hybrid organic-inorganic solar cell of claim 1, wherein an electrode that is proximal to said substrate comprises a semi-transparent or non-transparent electrode.

11. The hybrid organic-inorganic solar cell of claim 1, wherein said perovskite layer comprises material selected from the group consisting of $CH_3NH_3PbI_3$, $CH_3NH_3PbCl_3$, $CH_3NH_3PbBr_3$, $CH_3NH_3PbI_{3-x}Cl_x$, $CH_3NH_3PbI_{3-x}Br_x$, $HC(NH_2)_2PbI_3$, $HC(NH_2)_2PbCl_3$, $HC(NH_2)_2PbBr_3$, $HC(NH_2)_2PbI_{3-x}Cl_x$, $HC(NH_2)_2PbI_{3-x}Br_x$, $[HC(NH_2)_2]_{1-x}Cs_xPbI_3$, $CsPbI_{3-x}Br_x$, $[HC(NH_2)_2]_{1-x}Cs_xPbI_{3-y}Br_y$, $CH_3NH_3Pb_{1-x}Sn_xI_{3-y}Br_y$, $(CH_3NH_3)_{1-x-y}[HC(NH_2)_2]_yCs_xPbI_{3-z}Br_z$, $(CH_3NH_3)_{1-x-y}[HC(NH_2)_2]_yCs_xPb_{1-z}Sn_zI_{3-\delta}Br_\delta$, and $(CH_3NH_3)_{1-x-y-z}[HC(NH_2)_2]_zCs_yRb_xPbI_{3-\delta}Br_\delta$.

12. The hybrid organic-inorganic solar cell of claim 1, wherein an additional passivating barrier layer is disposed between said ETM layer and said electrode layer.

13. The hybrid organic-inorganic solar cell of claim 1, wherein an additional passivating barrier layer is disposed between said HTM layer and said electrode layer.

14. The hybrid organic-inorganic solar cell of claim 1, wherein the at least one passivating barrier layer is arranged to seal off said perovskite layer.

* * * * *